US006972412B2

(12) United States Patent
Scholtz et al.

(10) Patent No.: US 6,972,412 B2
(45) Date of Patent: Dec. 6, 2005

(54) PARTICLE-OPTICAL DEVICE AND DETECTION MEANS

(75) Inventors: Jacob Johannes Scholtz, AV Eindhoven (NL); William Ralph Knowles, Newbury, MA (US); Bradley Lamar Thiel, Cambridge (GB); Gerardus Van Veen, Waalre (NL); Rene Peter Marie Schroemges, Baarlo (NL)

(73) Assignee: FEI Company, Hillsboro, OR (US)

( * ) Notice: Subject to any disclaimer, the term of this patent is extended or adjusted under 35 U.S.C. 154(b) by 38 days.

(21) Appl. No.: 10/664,796

(22) Filed: Sep. 18, 2003

(65) Prior Publication Data

US 2004/0124356 A1    Jul. 1, 2004

Related U.S. Application Data

(63) Continuation-in-part of application No. 10/330,691, filed on Dec. 27, 2002, now abandoned.
(60) Provisional application No. 60/411,699, filed on Sep. 18, 2002.

(51) Int. Cl.[7] ............................................. H01J 37/00
(52) U.S. Cl. ........... 250/396 R; 250/310; 250/396 ML; 250/397
(58) Field of Search .................. 250/310, 311, 396 R, 250/397, 396 ML

(56) References Cited

U.S. PATENT DOCUMENTS

| 4,249,077 A | | 2/1981 | Crawford |
| 5,502,306 A | * | 3/1996 | Meisburger et al. ........ 250/310 |
| 5,578,821 A | | 11/1996 | Meisberger et al. |
| 6,172,363 B1 | | 1/2001 | Shinada et al. |
| 6,184,525 B1 | | 2/2001 | Van Der Mast |
| 6,329,826 B1 | * | 12/2001 | Shinada et al. ............. 324/751 |
| 6,365,896 B1 | | 4/2002 | Van der Mast |
| 6,525,317 B1 | | 2/2003 | Yang |
| 6,538,254 B1 | | 3/2003 | Tomimatsu et al. |

FOREIGN PATENT DOCUMENTS

JP          05-174768           7/1993

OTHER PUBLICATIONS

C.K. Crawford, Charge Neutralization Using Very Low Energy Ions, Scanning Electron Microscopy, 1979, II, SEM INc., USA.
Albert Folch et al., High Vacuum Versus, "Environmental" Electron Beam Deposition, Jul/Aug. 1996, B 14(4), pp. 2609-2614, J. Vac. Sci.
Yukinori Ochiai, Electron-Beam-Induced Deposition of Copper with Low Resistivity, Nov/Dec. 1996, B 14(6), pp. 3887-3891, J. Vac. Sci. Technol.

* cited by examiner

*Primary Examiner*—John R. Lee
*Assistant Examiner*—Paul M. Gurzo
(74) *Attorney, Agent, or Firm*—Michael O. Scheinberg

(57) ABSTRACT

A particle-optical apparatus comprising a sample holder for receiving a sample, a particle source embodied to produce a primary beam of first electrically charged particles along an optical axis for the purpose of irradiating the sample, first detector embodied to detect second electrically charged particles that emanate from the sample as a result of the irradiation thereof, a detection space that at the least is formed by the sample holder and the first detector, and an immersion lens embodied to produce a magnetic field for the purpose of focusing the primary beam in the vicinity of the sample holder. The first detector are embodied to produce an electric field in the detection space, and the detection space is embodied to comprise a gas.

28 Claims, 8 Drawing Sheets

PARTICLE-OPTICAL DEVICE AND DETECTION MEANS

This application claims priority from U.S. Provisional Pat. Appl. No. 60/411,699, filed Sep. 18, 2002, and is a continuation-in-part of U.S. patent application Ser. No. 10/330,691, filed Dec. 27, 2002, now ABN.

FIELD OF THE INVENTION

The invention relates to a particle-optical apparatus comprising a sample holder arranged for receiving a sample, a particle source arranged for producing a primary beam of first electrically charged particles along an optical axis for irradiating said sample, first detection means arranged for detecting electrons such as secondary electrons emanating from the sample due to said irradiation, a detection space formed by at least said sample holder and said first detection means, and an immersion lens arranged for providing a magnetic field for focusing the primary beam in the vicinity of the sample holder, wherein said first detection means are arranged for providing an electric field in the detection space, and wherein the detection space is arranged for comprising a gas,

BACKGROUND OF THE INVENTION

A device as described above is known from abstract number 5-174768(A) of Japanese patent application number 3-53811, which abstract was published on Jul. 7, 1993.

Such devices are better known by the name Environmental Scanning Electron Microscopes (ESEM), and are based on the principle of Scanning Electron Microscopes (SEM). In a SEM, a region of a sample that is to be investigated is probed by a primary beam of electrically charged particles (generally electrons) that move along an optical axis of the device. As a result of the energy released in collision, the charged particles incident on the sample causes the liberation of other charged particles in the sample, which emanate from the sample with a certain kinetic energy. The energy of these secondary particles, which is substantially lower than the energy of the particles in the primary beam, provides information on the nature, structure and composition of the sample. For this reason, a SEM is often provided with a secondary electron detection apparatus, which can detect these liberated particles. If, for example, the secondary electron detection apparatus is provided with an electrode that is maintained at a positive voltage, and if it is presumed that the secondary particles liberated from the sample are (negatively charged) secondary electrons, then these secondary electrons will move toward the electrode. The secondary electrons captured by the electrode produce a current in the detector, which current can be amplified and can yield the necessary information about the sample. Because the primary beam from the particle source probes a region of the sample, it is possible to obtain an image of the sample by compiling the information obtained with the aid of the detector. It will be apparent that, in connection with the quality of the image thus obtained, particularly the speed with which the image is recorded and the signal-to-noise ratio (SNR), it is useful to have the detected current as large as possible.

In an ESEM, the sample that is to be investigated is placed in an atmosphere of a gas having a pressure between 0.1 Torr (13 Pa) and 50 Torr (6575 Pa), whereas in a conventional SEM the sample is located in vacuum. The advantage of an ESEM as compared to a conventional SEM is that the ESEM offers the possibility to form electron-optical images of moist or non-conducting samples (for example: biological samples, moist samples, plastics, ceramic materials or glass fibers) which, under the usual vacuum conditions in the conventional SEM, would be difficult to image. The ESEM provides the possibility of maintaining the sample in its natural state, without having to be subjected to the disadvantageous effects of drying, freezing or vacuum coating, which are normally necessary in studies using conventional SEMs.

Another advantage of the employed gaseous atmosphere is the dissipation of the surface charge accumulating on the sample as a result of irradiation (assuming the sample to be a non-conducting sample), as a result of which the resolving power of the microscope is increased.

The use of a gaseous atmosphere in an ESEM also makes improved detection means possible. In an ESEM, the liberated secondary electrons that move in the direction of the secondary electron detector will collide en route with gas molecules present in their path. This collision will result in the liberation of new electrons (so called daughter electrons) from the gas molecules, which will also move in the direction of the secondary electron detector. In their turn, these newly liberated daughter electrons will again collide with other gas molecules, etc., so that, as a result of using the gas atmosphere, an amplification of the secondary electron signal occurs. It will be apparent that, the greater the distance that the secondary electrons have to travel to the secondary electron detector, the greater the number of collisions that will occur between secondary electrons and gas molecules. In this scenario, one should make allowances for the fact that the dimensions of the sample chamber or detection space of the electron microscope are preferably such that the length of the path that the primary beam must traverse through the pressurized sample chamber is as small as possible. This is because the gas molecules present also cause scattering of the primary beam, seeing as electrons from the primary beam can collide with the gas molecules.

In the cited abstract number 5-174768, an ESEM is disclosed wherein the primary beam from the particle source is focused on the sample by means of an immersion lens. The immersion lens consists of a magnetic dipole whose poles are located on opposite sides of the sample chamber formed by the sample holder and primary beam source. In this manner, a magnetic field is present in the sample chamber. The secondary electrons liberated from the sample will be influenced by the magnetic field while on their way to the detector, as a result of which they will follow a helical path. It is claimed that in this way, the distance traversed by the secondary electrons is greatly increased, so that the collision probability proportionately increases and the amplification factor of the detection apparatus increases. A disadvantage of the disclosed device described here above is that, in the given configuration, the electrons follow a helical path around an axis that extends parallel to a magnetic field. The distance traversed by the electron from the sample to the detector is directly dependent upon the distance between the detector and the sample in the direction of the magnetic field. In the illustrated case, this means that the detector electrode should be located as high as possible above the sample, so as to achieve as large an amplification factor as possible. Attendant upon this is the fact that the distance traversed by the primary beam through the sample chamber (and thus through the gaseous atmosphere) shall also be large. As a result of this, scattering of the primary beam will increase. An increased amplification factor for the detection apparatus is thus achieved at the expense of the resolving power of the illustrated device.

SUMMARY OF THE INVENTION

It is therefore an object of the present invention to provide a particle-optical device in which the working distance (the distance traversed by the primary beam through the detection space) is as small as possible, but the amplification factor of the detection means is as large as possible. It is to be understood that detection includes direct collection of charged particles and induction of signal in an external circuit caused by the movement of charged particles.

These and other objects have been achieved in the present invention in that said first detection means and said immersion lens are arranged for providing the electric field and the magnetic field such that the detection space comprises a first portion in which the electric field is oriented transverse to the magnetic field. It can be shown that the motion of the low energy electrons in this field structure can create a large amplification factor, provided that certain values of electric field and magnetic field are present. It can further be shown that this large amplification can take place even with a low pressure of gas, which further reduces the scattering of the primary beam.

The invention makes use of the principle that the resultant force $\overline{F}$ (by $\overline{F}$ the vector F is meant here) on an electrically charged particle, such as an electron, moving through a magnetic field and an electric field is comprised of the electrical force $\overline{F}_E$ and the magnetic force $\overline{F}$ on the particle. The electrical force $\overline{F}_E$ is, dependent on the charge of the particle, parallel or anti-parallel to the electric field $\overline{E}$, and the magnetic force is oriented perpendicular to the velocity $\overline{v}$ of the particle and the magnetic flux $\overline{B}$. The direction of the magnetic force $\overline{F}$ is further determined by the polarity of the charge of the particle (positive/negative).

The electrical force and magnetic force are given by:

$$\overline{F}_E = q\overline{E} \quad (1)$$

$$\overline{F}_B = q(\overline{v} \times \overline{B}) \quad (2)$$

where q is the charge of the particle (which can be positive or negative).

The resultant force F is given by the following vector relationship:

$$\overline{F} = \overline{F}_E + \overline{F}_B = q \cdot (\overline{E} + \overline{v} \times \overline{B})$$

The present invention makes use of the motion followed by an electron that starts from rest (or low energy) in a magnetic field that is orthogonal to an electric field. The electrons will follow a so called cycloidal path and the kinetic energy of the electron will cycle repeatedly from the starting energy to a higher energy and then back to the original energy. This cycle will repeat indefinitely in high vacuum. However, in a gaseous environment the electron may collide with a gas molecule. If the kinetic energy of the electrons exceeds the ionization energy of the gas present in the detection space, then the electron is capable of liberating another electron (called a daughter electron) in a collision with a gas molecule. When these collisions occur, the original electron, and the daughter electron will also follow a cycloidal path and a chain reaction may result in a large number of electrons for each secondary electron. Thus, there is a large amplification of the secondary electron signal. This amplified signal is collected at the electrodes that provide the electric field.

In a further embodiment of the present invention the electric field may have radial symmetry, and the electron will follow a generally circular path, combined with the cycloidal motion. The same large amplification may occur. This radial electric field can be conveniently provided by an annular electrode, which may also serve as the signal detector. It can further be shown that this large amplification factor can occur at low pressures of the gas.

It will be understood that, because the electric field and the magnetic field are, in principle, to be oriented perpendicular to one another, the distance traversed by the particle between the sample and the detector is not dependent upon the working distance traversed by the primary beam of primary electrons through the detection space. The distance traversed by the particle is dependent upon the distance between the optical axis and the most closely located point of the detector electrode. Performing the detection technique described will not be at the expense of the resolving power of the particle-optical apparatus. Of importance to the above is that, in at least a portion of the detection space, the electric field must have a component $\overline{E}$ that is perpendicular to the magnetic field $\overline{B}$ of sufficient magnitude to bring electrons in the cycloidal motion to a kinetic energy that is higher than the ionization energy of the gas molecule. From this, an average person skilled in the art will be able to calculate those parameters that are of importance with regard to the electric field and magnetic field.

In an embodiment of the present invention, a particle-optical device is disclosed in which the first detection means and the immersion lens are further arranged for providing the electric field and the magnetic field such that the detection space comprises a second portion in which the electric field and the magnetic field are parallel.

If, in a second portion of the detection space, the electric field has a component $\overline{E}$ that is parallel to the magnetic field $\overline{B}$ then a particle that has a random velocity that is not completely parallel to the magnetic flux $\overline{B}$ will follow a helical path. An explanation for this is that as a result of the electrical force $\overline{F}_E$ the particle will be accelerated uniformly in the direction of the electric field $\overline{F}_E$. However, the component of the velocity V" of the particle that is perpendicular to the magnetic flux $\overline{B}$ will experience a force $\overline{F}_B$ that is perpendicular to the velocity and the magnetic field. This component of the velocity V" of the particle perpendicular to the magnetic flux $\overline{B}$ will consequently vary continually in direction. The particle will accordingly describe a helical motion around an axis that is oriented in the direction of the electric field E.

If the electric field $\overline{E}$ can be made to change from positive to negative then the secondary electrons will oscillate backwards and forwards while also describing the helical motion due to the magnetic field. The combination of these two motions will greatly increase the path of the electrons in the gas, and thereby increase the amplification of the signal. As a result of this, the detector of the particle-optical device of the present invention will become more sensitive.

In another embodiment of the particle-optical device of the present invention, the first detection means comprise a first electrode that is arranged for providing the electric field and for detecting the secondary and daughter electrons, whereby the first electrode comprises a central opening which is symmetrically arranged around the optical axis. This embodiment provides a simple set-up for generating a radially symmetric electric field around the optical axis. The set-up, wherein the sample holder in which the sample is located during operation is disposed in extension of the optical axis, will, when the dimensions of the central opening are suitably chosen, generate an electric field that, in the vicinity of the detector, comprises a large component perpendicular to the optical axis, and, furthermore, in the vicinity of the sample holder, will comprise a large component parallel to the optical axis. By generating a magnetic field that is principally parallel to the optical axis, using techniques known to the skilled artisan, the aforementioned embodiments are obtained, whereby the detection space comprises regions in which the electric and magnetic field are parallel as well as regions in which the electric and magnetic field are directed perpendicular or transverse to one another. In this manner, the invention can be applied in an easy manner in a particle-optical device.

In yet another embodiment, a particle-optical device further comprises second detection means that are arranged for detecting second charged particles, such as ions, that are formed in the gas due to interactions between the gas and the electrons. Because, for example, the secondary electrons collide with the gas molecules in the detection space, not only will daughter electrons be formed when the kinetic energy of the secondary electrons exceeds the ionization energy of the gas molecules, but also electrically charged gas ions (second charged particles). By detecting these gas ions with second detection means, it is possible to receive an additional signal that provides information on the composition and nature of the sample. Since the polarity of the gas ions is opposite to that of the secondary electrons, the detection thereof will, at the outset, yield a signal that can be regarded as the negative of the signal from the first detection means.

In yet another embodiment of the present invention, the detection means comprise a second electrode that is located between the sample and the first detection means, whereby the second electrode comprises a central opening that is symmetrically disposed around the optical axis.

Such an electrode offers the advantage that it does not asymmetrically disturb the radial electric field of the first electrode. Since electrons are usually more mobile than ions, in view of their mass, the placement of the second electrode between the first electrode and the sample will yield the advantage that ions will be more easily captured by the second electrode. The positive ions will thus collide with the second electrode, whereby they will be neutralized by recombination and will thus cause a signal which may be measured from the second electrode.

In another embodiment of the invention, the sample holder comprises a third electrode, and the third detection means are at least comprised by the sample holder.

In such an embodiment, some of the positively charged ions from the gas are collected by the sample holder. In this manner, a current can be generated in the third detector, which provides the desired signal.

Another embodiment of the invention further comprises fourth detection means arranged for detecting photons that have been liberated as a result of interactions between the gas and the electrons. As a consequence of the collisions between, for example, secondary electrons from the sample and gas molecules, photons may be generated that can be detected by fourth detection means. The number of detected photons, i.e. the intensity of the detected light, is proportional to of the number of collisions that have taken place between secondary electrons and gas molecules. Consequently, the detected light intensity is directly related to the secondary electron signal from the sample and the signal from the first detector. The detection of these photons provides information on the sample, which information may be used in signal processing and image formation.

A preferred embodiment of the present invention further comprises means for the provision of a signal based on a combination of at least two signals provided by the first, second, third and fourth detection means.

By combining signals from the different detection means, the signal-to-noise ratio may be increased. The signals obtained with the detectors will comprise a certain quantity of noise. If one compares the signal from the first detector with a signal from one of the other detectors, some of the noise present in the signals from the various detectors will be correlated, and some uncorrelated. This enables a number of techniques, known to an average person skilled in the art, to remove the noise.

In yet another embodiment of the present invention, a particle-optical device comprises means that are embodied to electrically bias the sample with a negative bias. In such a scenario the electric field between the sample and the first detector will increase, which will increase the amplification in the gas.

In a second aspect of the invention, the present invention relates to detection means comprising a ring-shaped electrode and amplification means arranged for use as first detector means in a particle-optical apparatus according to a first aspect of the invention.

In a third aspect the present invention relates to a method of detecting electrons in a particle-optical apparatus wherein a sample is irradiated by a primary beam of charged particles and secondary electrons are liberated from said sample by said irradiation, wherein said secondary electrons are accelerated towards detection means and a detection space is at least formed by said detection means and said sample, said detection space comprising a gas, and wherein an immersion lens provides a magnetic field in said detection space, wherein said electric field and said magnetic field are provided such that the detection space comprises at least a portion wherein the electric field is oriented transverse to the magnetic field.

BRIEF DESCRIPTION OF THE DRAWINGS

The invention shall be further elucidated with the aid of a number of embodiments thereof, with reference to the attached drawings and the reference numbers contained therein, whereby it is to be noted that the described embodiments do not have an exclusive effect on the scope of protection as set forth in the claims of the application, read in the light of the description and drawings, wherein:

DETAILED DESCRIPTION OF THE PREFERRED EMBODIMENTS

Figure 1B:
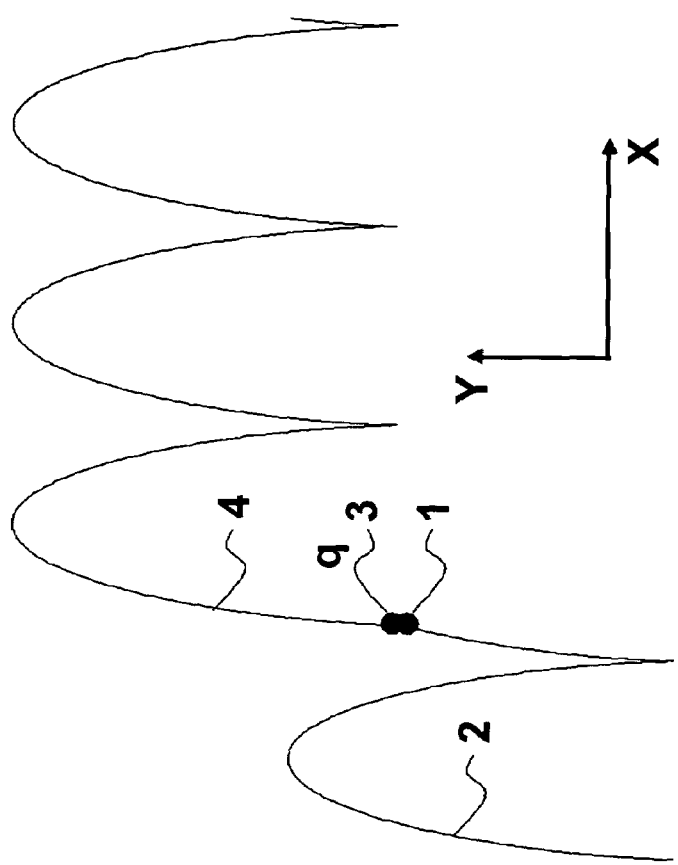
FIG. 1b further depicts an electron propagating through the fields in a gaseous environment, showing a collision between the electron and a gas molecule, thereby producing a daughter electron. The schematic further depicts the subsequent path of both electrons.
Figure 1A:
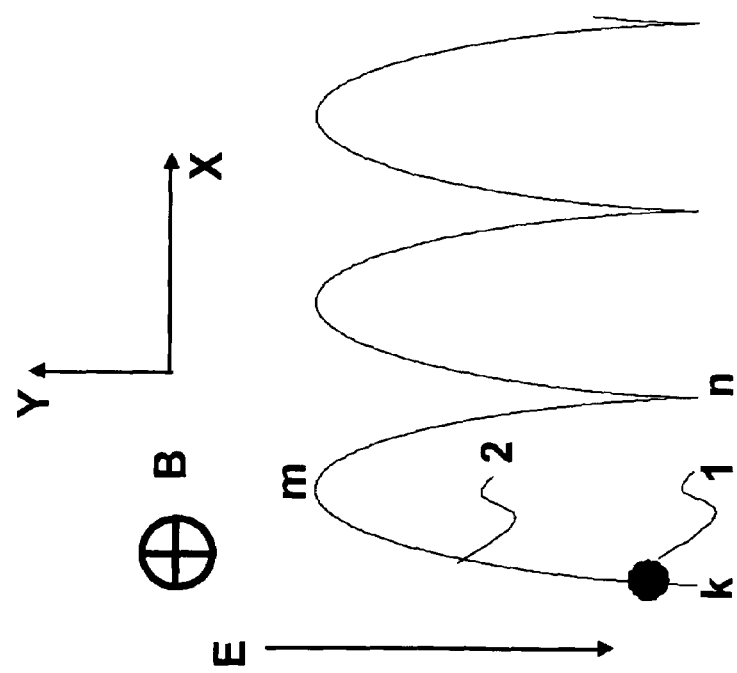
FIG. 1a renders a schematic depiction of path of an electron propagating through a magnetic and an electric field, whereby the electric field is transverse to the magnetic field in a vacuum.

FIG. 1a is a schematic depiction of the motion of an electron 1 that starts with zero velocity at k and moves under the influence of electric field E (which is parallel to the Y axis) and magnetic field B (which is perpendicular to the page, and directed into the page). Initially the electron accelerates in Y due to the electric field E. The electron experiences a force in the X direction due to the influence of the magnetic field and the electron velocity. This causes the electron to follow the path depicted as 2. At the point designated m, the electron achieves maximum velocity and maximum energy. During the passage from m to n the electron decelerates until it comes to rest again at n. This motion is known as a cycloidal motion. If the field E is constant along all points in the X axis, then the cycloidal motion will be repeated indefinitely provided that the electron is in a vacuum. This motion of an electron is well known to those expert in the art, and is known as the planar magnetron.

FIG. 1b depicts the situation where the electron is in a gaseous environment. As the electron follows the cycloidal path it will eventually collide with a gas molecule, depicted as point q. If the electron energy at q exceeds the ionization energy of the gas molecule then the gas molecule will be ionized and another electron is liberated. This second electron is designated a daughter electron 3.

The original electron 1 and the daughter electron 3 will both start from q and will undergo the cycloidal motion shown as 4. These two electrons may each ionize further gas molecules, thereby causing a cascade multiplication. This mechanism is exploited in the primary claim of the present invention.

Figure 2:
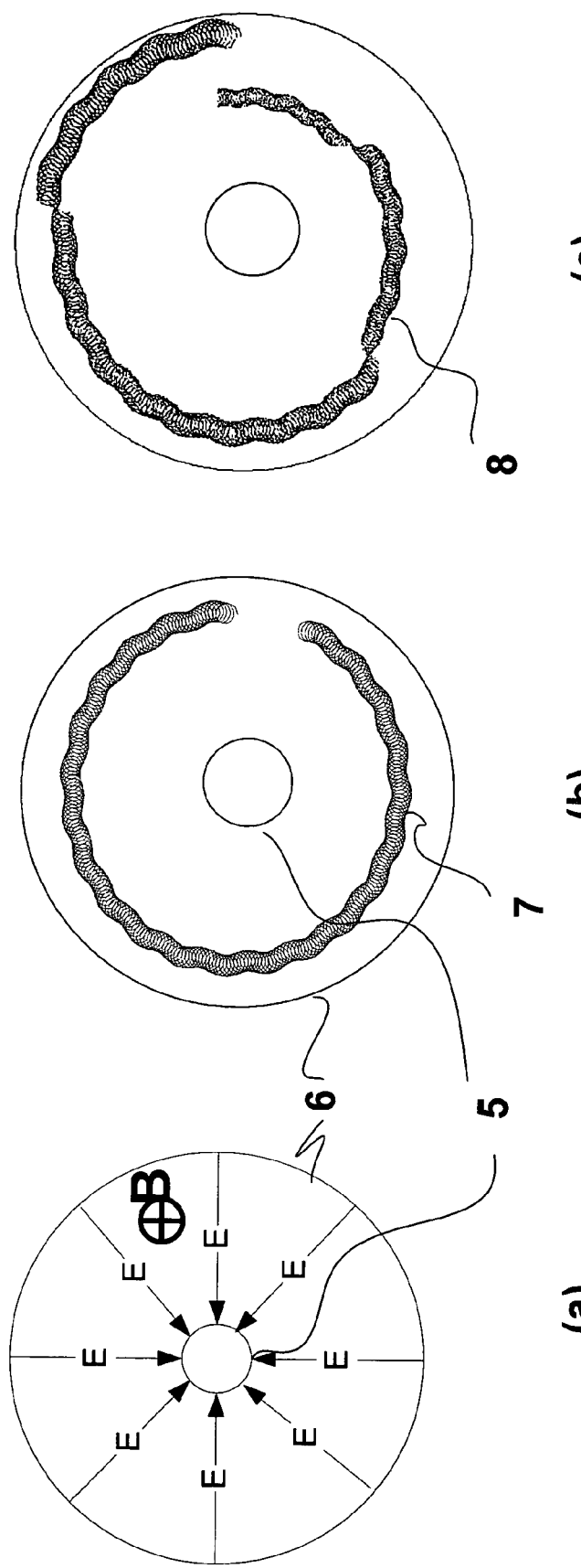
FIG. 2a shows the field from a magnetron where the electric field is transverse to the magnetic field and the electric field is radially symmetric.
FIG. 2b depicts the motion of an electron in this field in a vacuum, and FIG. 2c further depicts the motion of an electron in this field in a gas.

FIG. 2a shows a cylindrical magnetron field configuration. There are two cylindrical elements, the inner electrode 5 and outer electrode 6 with a potential applied between the electrodes. The Figure depicts the situation where the outer electrode is at a more positive voltage than the inner electrode, creating the electric field E which is radially symmetric. Again, there is a magnetic field B (which is perpendicular to the page). It can be shown that an electron starting from rest in a vacuum between the electrodes will accelerate towards the outer electrode and may undergo a motion similar to the cycloid shown in FIG. 1, but while at the same time travel in a generally curved path around the inner electrode. This path is depicted as 7 in FIG. 2b.

If the space between the two electrodes is filled with a gas then ionization may occur and daughter electrons may be generated (as described above for the planar magnetron). At each collision, the electron and the daughter electron will be closer to the outer electrode. This is depicted in FIG. 2c. Eventually, the original electron and the cascade of daughter electrons will reach the outer electrode. Thus each original electron will generate an amplified number of electrons at the outer electrode. If the original electron is representative of information about the sample, then the signal collected at the outer electrode is an amplified version of this information. Another advantage of this amplification mechanism is that the electron will continue to orbit between the inner and outer electrodes until a collision with a gas molecule occurs. Hence, the large amplification occurs even at low gas pressures.

The generation of daughter electrons and the subsequent cascade amplification will occur provided that certain values of E and B are present. The maximum energy of the electron in the cycloidal motion is given by $2*m*(E/B)^2/q$, where m is the mass of an electron and q is the charge of an electron. If this maximum energy is greater than the ionization energy of the gas, then an ionizing event can occur and a daughter electron can be generated. Hence, for a given value of B, there is a Critical value of E that is required. In a circular symmetric electric field the value of E varies with radius, and in order to obtain a large amplification the Critical value must be provided over a large part of the detection space.

It is well known to those expert in the art that a radial electric field may be provided by various different structures. For example it is known that a ring electrode or a plate electrode with a circular hole will both provide a radially symmetric electric field. Further it can be shown that the electric field produced by a ring or a plate electrode will produce the preferential amplification described. Hence, the ring or plate may be placed symmetrically about the charged particle beam which minimizes the effect of the electric field on the charged particle beam. It is also well known to those expert in the art that the required axial magnetic field may be provided by various different structures. A suitable magnetic field can be provided by a so called immersion lens of a charged particle beam apparatus, or within the polepiece of a so called pinhole lens of a charged particle beam apparatus, or provided by the so called single pole lens of a charged particle beam apparatus.

Figure 3:
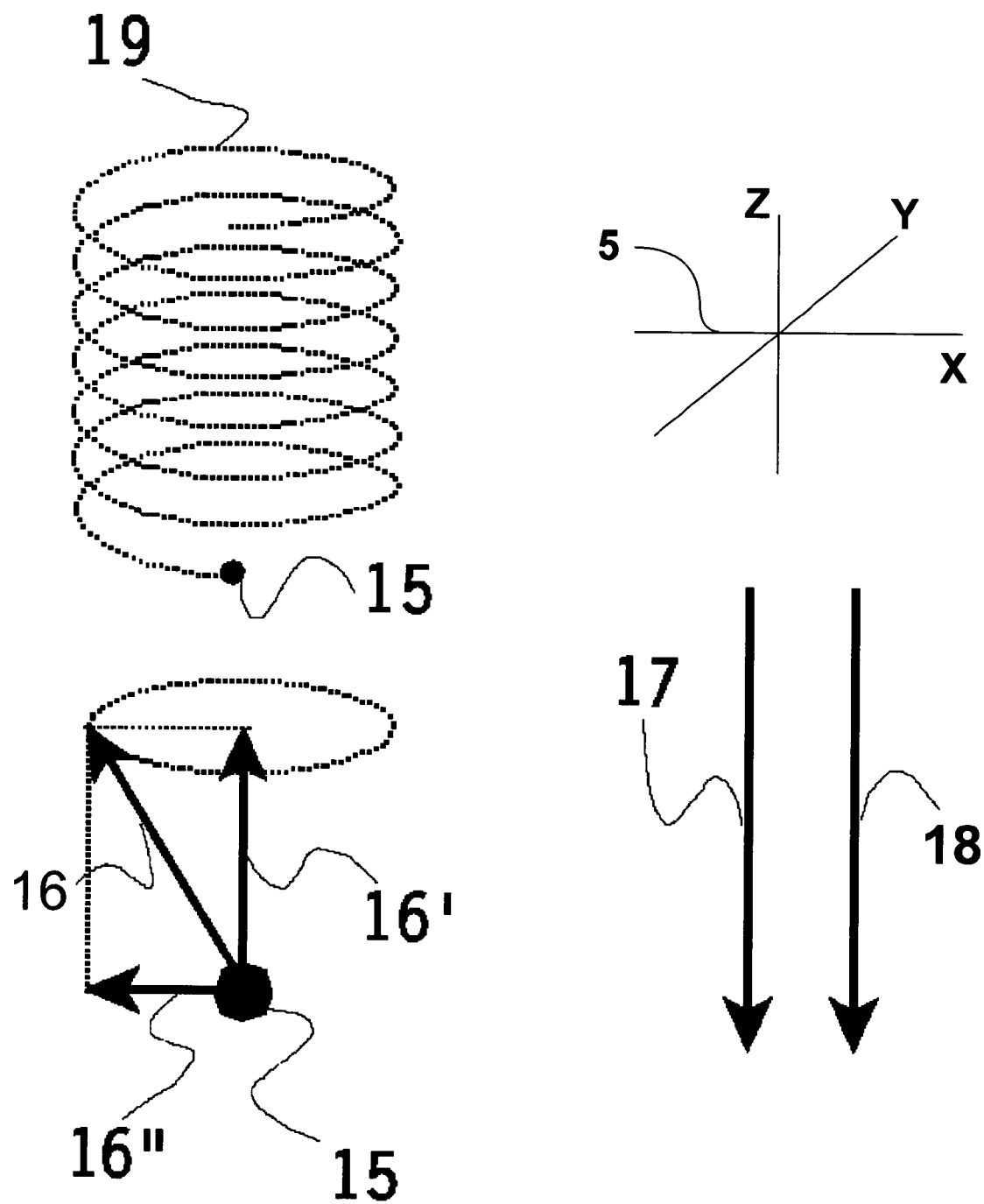
FIG. 3 renders a schematic depiction of the path of an electron propagating through a magnetic and an electric field, whereby the magnetic field and the electric field are parallel to one another, and the electron has initial velocity components parallel and perpendicular to the fields.

FIG. 3 shows the case in which an electron 15, which may, for example, be a secondary electron liberated by an electron primary beam from a sample, propagates through an electric and a magnetic field, whereby the electric field strength 18 and the magnetic field strength 17 are principally parallel to one another and in the direction of the Z axis as shown by coordinate axes 5. By this is meant that the electric field strength 18 and the magnetic field strength 17 have parallel components that are much larger than the components that are perpendicular to one another. In this situation, an electron 15 has, for example, an initial velocity 16, which initial velocity 16 has a component 16' parallel to (but, for example, oppositely directed to) the electric field 18 and the magnetic field 17, whereby the velocity 16 further has a component 16" that is perpendicular to the electric field and the magnetic field 17.

The electric field 18 will, at the outset, uniformly accelerate the electron 15 in a direction opposite to that of the electric field 18. The component 16" of the velocity that is perpendicular to both fields 17 and 18 will ensure that an interaction arises with the magnetic field, giving rise to a magnetic force on the electron that is continually perpendicular to the velocity component 16". In this manner, in part because of the acceleration in the direction opposite to that of the electric field 18, the particle will traverse a helical or screw-thread-like path. The radius of this path will be determined by the so-called Larmor radius, with which the average skilled artisan is familiar.

Figure 4:
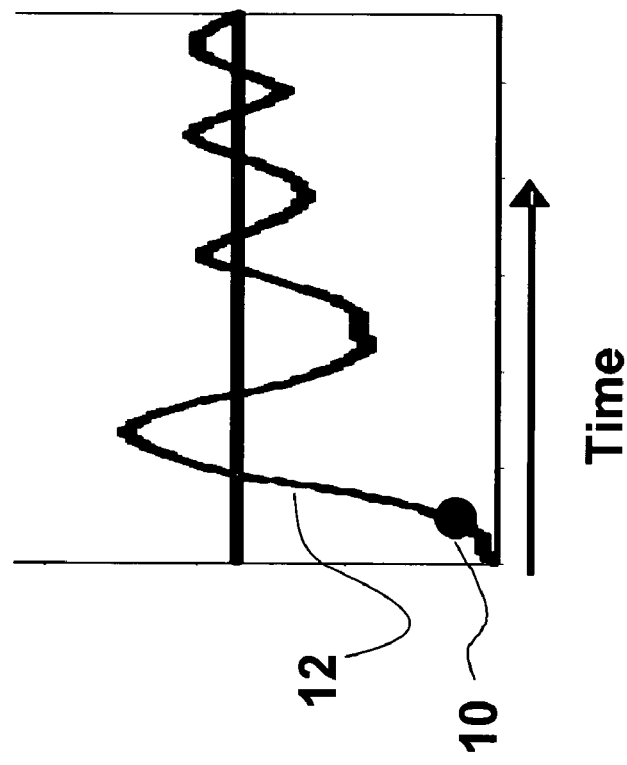
FIG. 4a depicts an electric potential that increases and then decreases again along a z axis.
FIG. 4b depicts the motion of an electron in the potential gradient of FIG. 4a in a gaseous environment.
Figure 4:
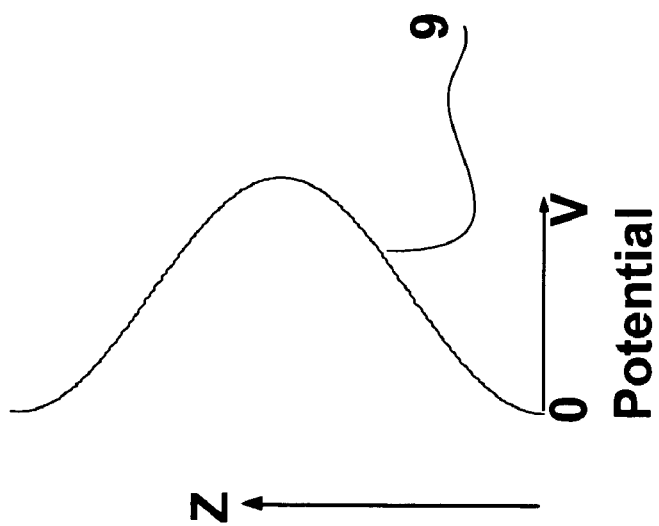

FIG. 4a depicts a situation where an electric potential 9 increases along the Z axis to a maximum value V and then decreases. An electron 10, subject to this potential, will at first be accelerated by the electric field created by the potential, then will decelerates again, and then reverse direction. That is, the electron 10 will, if unobstructed, oscillate around the point or plane of highest potential.

The path followed by the electron in a gaseous environment is depicted by 12 in FIG. 4b. There will be collisions between the electron and the gas which will cause the electron to lose energy. The electron will oscillate in the electric field but the amplitude will decrease. If the electric field is sufficiently intense then the electron may gain sufficient kinetic energy to cause a gas molecule to be ionized during the collision, thereby generating a daughter electron. The daughter electron may also be accelerated by the electric field and a cascade amplification may occur.

In a practical situation the electrons generated in this cascade will drift towards the electrodes that provide the electric field and the cascade will be prematurely terminated. It is very beneficial to provide a magnetic field that is parallel to the electric field creating the potential of FIG. 4a, so that the helical motion described in FIG. 3, combines with the oscillation effect of FIG. 4b to provide an even greater cascade amplification. Those skilled in the art will recognize this combination as the so called magnetic Penning effect.

Figure 5:
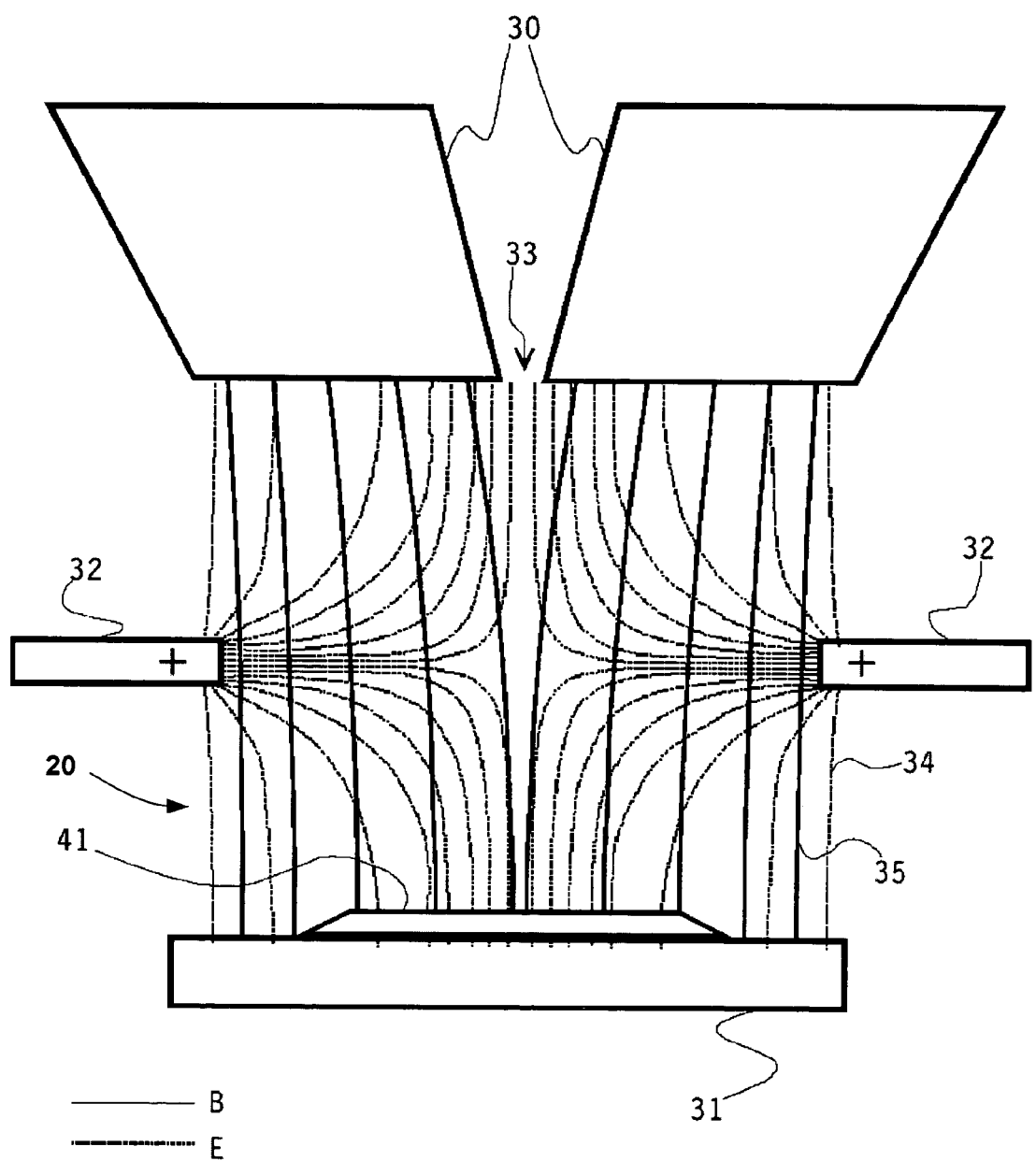
FIG. 5 is a schematic depiction of a detection space of an embodiment of a particle-optical device according to the present invention, in which electric and magnetic field lines are depicted.

FIG. 5 schematically depicts a detection space 20, which detection space is formed at least by a ring-shaped anode 32 (depicted in cross section) and a schematically depicted base structure 31 of a particle-optical device comprising a sample 41. A (non-depicted) electron primary beam is generated by a (non-depicted) electron source, whose edge (of which only the extremity 30 is shown in the figure) forms a first pole of a magnetic dipole. The base structure 31 of the particle-optical device may form the second pole of the magnetic dipole. In this scenario, a magnetic field arises that is schematically depicted by the magnetic field lines 35.

Anode 32 is typically biased at a positive potential between 10 V and 2000V. The primary beam opening 33 and the base structure 31 are typically biased at ground potential. These conditions typically provide an electric field that is schematically depicted by the electric field lines 34. It can be shown that the potential distribution along the Z axis has the desired form depicted in FIG. 4. Furthermore, an electron primary beam (not depicted), which is focused by the magnetic field 35, passes through the primary beam opening 33 of the electron source, traverses the detection space 20, and impinges on sample 41 that is located on top of the base structure 31. Located in the illustrated detection space 20 is a subspace in which the electric field lines 34 and the magnetic field lines 35 are principally perpendicular to one another. As can be seen in FIG. 5, this subspace is principally formed by the opening in the ring-shaped anode 32.

The detection space 20 further comprises a subspace in which the electric and magnetic field lines are oriented principally parallel to one another. This subspace is at least bordered by the base structure 31. In the depicted example, such a subspace is present in the vicinity of the extremity 30 of the electron source. It will be understood that the schematic depiction given in FIG. 5 has a radial symmetry about a (non-depicted) primary beam axis that traverses the primary beam opening and is perpendicular to the base structure 31.

It can be shown that the motion of the low energy electrons in this field structure can create a large amplification factor, provided that certain combinations of values are present for the electric field and magnetic field. The anode hole size is a factor in determining the strengths of the parallel and transverse components of the electric field. If the hole in the anode is too small, then the amplification will be enhanced by the magnetic Penning mechanism, but the magnetron mechanism will be degraded or absent because the electric field will not achieve the critical value described above with respect to FIG. 2. If the hole is too big, the amplification enhanced by the magnetic Penning mechanism may be absent, although the magnetron amplification may be increased. It can be shown that when conditions are present to enable both the magnetic Penning mechanism and the magnetron mechanism, large amplification can take place even with a low gas pressure, which further reduces the scattering of the primary beam.

Figure 7:
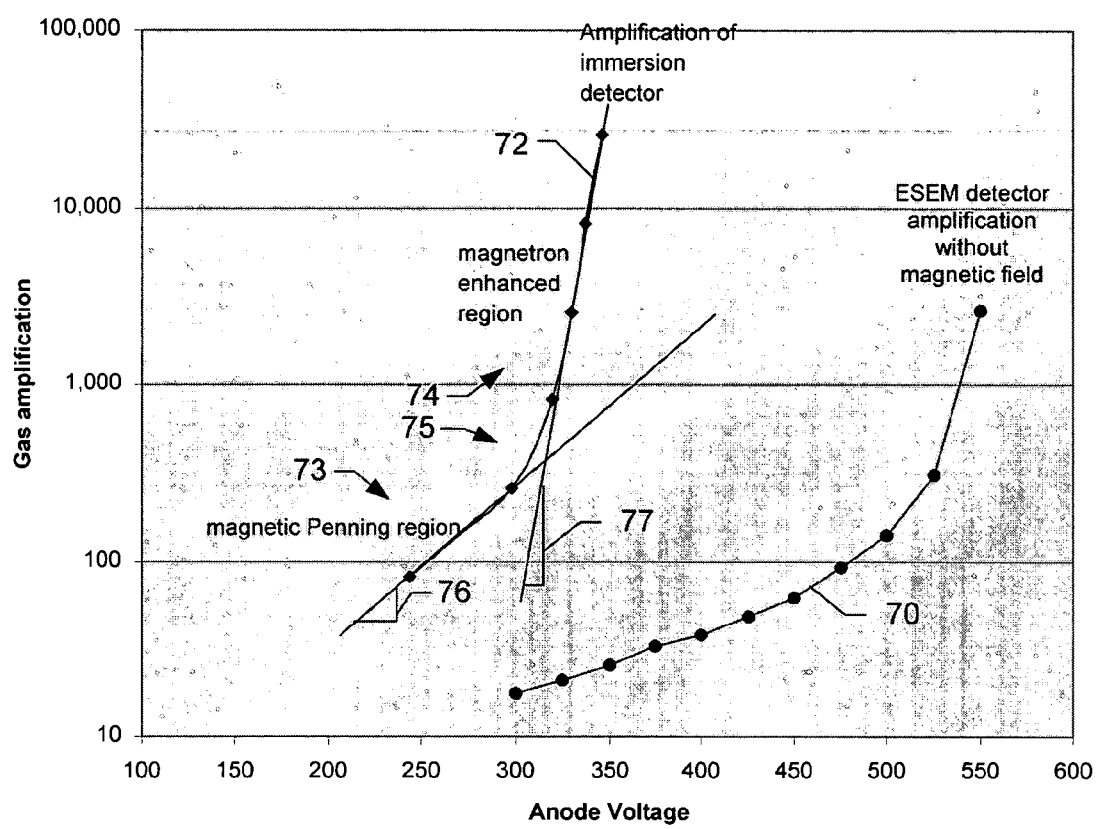
FIG. 7 is a graph showing gas amplification as a function of anode voltage for an ESEM detector without a magnetic field in the detector space and for an ESEM detector used with an immersion lens that provides a magnetic field.

FIG. 7 shows a graph of the gas amplification as a function of anode voltage. Gas amplification is the number of charges detected for each secondary electron. Line 70 shows the amplification of an ESEM detector in the absence of a magnetic field in the detection space, whereas line 72 shows the amplification of an ESEM detector used with a magnetic immersion lens that provides a magnetic field in the detection space. Line 72 is comprised of a first region 73, in which the amplification process is characterized primarily by a Penning mechanism; a second region 74 in which the amplification is characterized by a combination of a magnetron mechanism and a Penning mechanism; and a transition region 75. The slope 76 of the Penning mechanism region 73 is significantly less than the slope of the slope 77 of the combined mechanism region 74. As shown in FIG. 7, the combined mechanism can provide gas amplification greater than about 1000, greater than about 2000, greater than about 5000, and greater than about 10,000, all with anode voltages below about 350 V or about 400 V. Embodiments of the invention that operate above transition region 75 and in the combined region 74 provide substantially greater amplification than prior art detectors that operate solely in Penning region 73. Line 72 shows data from one embodiment, and skilled persons will recognize that that other embodiments will produce different amplification and different slopes.

Hence, the detection space 20 depicted in FIG. 5 may provide the conditions for both the magnetic Penning mechanism, and the conditions for the magnetron, provided that appropriate values for the dimensions are chosen, and provided that appropriate values of potential on anode 32, and magnetic field B are chosen for the given anode hole size. The amplification of this detection space can be very high due to the multiplicative effect of the amplification using the magnetic Penning mechanism and magnetron mechanism.

A set of conditions that provides conditions for both the magnetic Penning mechanism and for the magnetron mechanism includes an anode hole size about 3 mm, a magnetic field of up to about 0.3 Tesla, an anode potential greater than about 400 V, and a gas pressure of about 0.3 Torr. These conditions are known to produce an amplification that is much greater than any previous ESEM detector at 400V. Typical operational pressures are between 0.1 Torr and 0.7 Torr.

Figure 6:
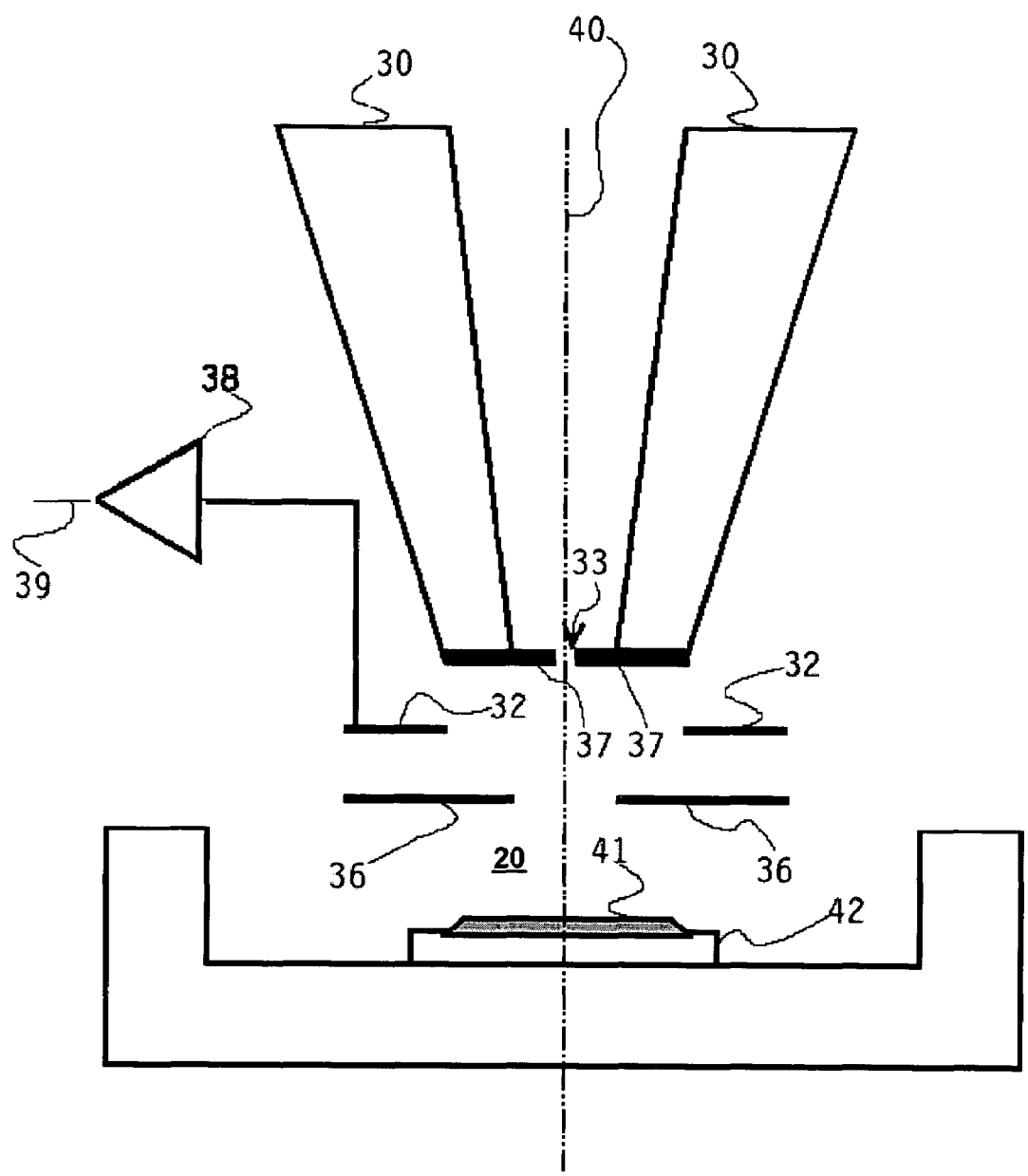
FIG. 6 is a schematic depiction of an embodiment of the present invention.

The detection space 20 depicted in FIG. 5 is shown once again in a schematic depiction of the embodiment of the present invention in FIG. 6. Parts that have a similar functionality to that in FIG. 5 are indicated using correspondingly similar reference numerals. Also visible in the depicted embodiment is an ion plate 36, which, if desired, can be biased or can be earthed. Maintenance of the pressure difference between the vacuum atmosphere in the electron source and the necessary atmosphere in the detection space 20 occurs by means of the separation diaphragm 37. The primary beam opening 33 is now part of the separation diaphragm 37. Furthermore, the ring-shaped electrode 32 is connected to an amplifier 38, which is biased to provide the potential on anode 32. Amplifier 38 produces a signal at the output 39 that is proportional to the number of detected electrons. A primary beam generated by the (non-depicted) electron source will pass along the optical axis 40, through primary beam opening 33, across detection space 20 and impinge on a sample 41, which sample is temporarily fixed to a sample holder 42.

The (non-depicted) electric field generated by the ring-shaped anode 32, and the (non-depicted) magnetic field generated by the magnetic dipole formed by the wall of the electron source 30 and the base structure 31, will ensure that, in analogy to FIG. 5, a subspace is formed in the vicinity of the sample 41, in which subspace the electric field and the magnetic field are parallel to one another. Each secondary electron liberated by the primary beam from the sample 41 can, as a consequence of the so called "magnetic Penning" mechanism shown in FIG. 4 generate a number of daughter electrons in the center of the anode 32. Collisions with the gas cause these electrons to depart from the center of the anode and they then undergo the magnetron motion. Hence, each daughter electron generated using the magnetic Penning mechanism may generate more daughter electrons as a result of the magnetron motion. Thus a two stage amplifier is formed so that a very large number of electrons may reach the anode for each original secondary electron.

In some embodiments, ions generated in the gas may be used may be used to counteract charging of the sample due to the charged particle beam.

The generation of daughter electrons using the magnetic Penning mechanism and magnetron mechanism will also generate positively charged gas ions. Some of these ions will migrate to the separation diaphragm 37 and some will migrate towards the sample 41. Some of the ions that migrate to the sample are required to dissipate the charge induced in the sample due to the charged particle beam. However, the high amplification factor of this detection volume may generate a surplus of ions. These surplus gas ions may be collected by an electrode between the sample and the anode. Such an electrode could take the form of a grid, a wire, a set of wires, or a plate such as the ion plate 36. The electrode may be electrically biased, or at ground potential.

In another embodiment, the distance between the base structure 31 and the wall of the electron source 30 can be chosen to be so small that the subspace in which the electric and magnetic field are principally parallel to one another is very small, or even absent. The detection space is therefore very "flat", and the electric and magnetic field will be principally transverse to one another. The secondary electrons liberated from the sample 41 shall thus immediately be subjected to circumstances under which the electric field and the magnetic field are principally perpendicular to one another. The amplification using the magnetic Penning mechanism may be absent but the detector combination 32, 38, 39 can still achieve a large amplification factor due to the magnetron, which is sufficiently large to produce the desired signal at the output of the detector 39, while the working distance -being the distance that the electron primary beam must traverse through the detection space 20 from the primary beam opening 33 to the sample 41—can be kept as small as possible. Scattering of the electron primary beam off gas molecules present in the detection space will be kept to a minimum in this embodiment.

The quality of the detected signal can be improved by detecting other signals that are produced during irradiation of the sample and detection of the secondary electrons.

Figure 8:
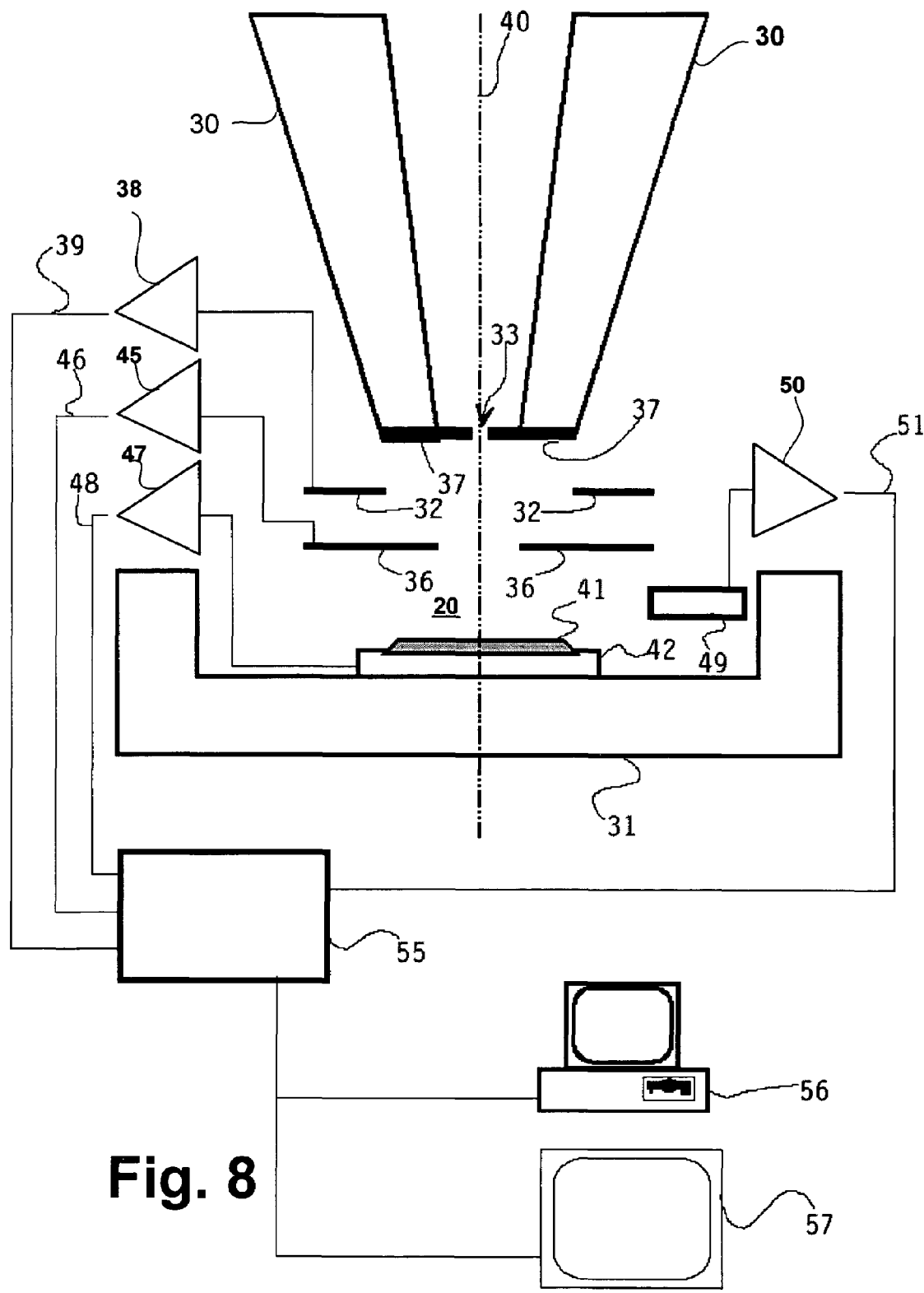
FIG. 8 is a schematic depiction of another embodiment of the present invention.

FIG. 8 depicts an embodiment that is analogous to the embodiment of FIG. 6, except for the addition of a number of additional detection means. Parts with a functionality that is the same as the functionality of similar parts in FIG. 6 are indicated using correspondingly similar reference numerals. Furthermore, it is noted once again that the illustrated embodiment is a cross-section of an embodiment of a particle-optical device according to the current invention, which demonstrates a principally radial symmetry about the optical axis 40. It is seen in FIG. 8 that the ion plate 36, which is embodied to capture excess gas ions that are generated because secondary electrons liberated from the sample 41 collide with gas molecules present in the detection space, is connected to an amplifier 45 that produces a signal at the output 46 that is proportional to the number of captured ions. The signal received at output 46 will generally be opposite in sign to the signal detected at output 39, because of the different polarity of the detected particles. If an image is produced on the basis of the signal received at output 46, then this will be a negative of the image produced on the basis of the signal generated by the detector combination 32, 38 and 39.

The signals at the outputs 39 and 46 can now be combined with one another such that the signal-to-noise ratio of the resultant signal is improved. It is noted that some of the noise present in the signals from the detectors is correlated, enabling a number of filtering techniques that are known to an average person skilled in the art. FIG. 8 further depicts a sample holder 42, whereby the sample holder 42 forms, for example, a detection electrode. By connecting this detection electrode to an amplifier 47, one produces at the output 48 of the amplifier a signal that is proportional to the number of positive ions migrating to the sample 41. In a manner similar to that described here above, the signal at this output can be used to improve the signal-to-noise ratio, or to improve the quality of the imaging.

A further possibility to obtain information on the sample from the particle-optical device is offered by photon detector 49, which is connected to amplifier 50, producing at output 51 a signal that is proportional to the light intensity present in the detection space. As a consequence of the collisions between, for example, secondary electrons from the sample and gas molecules, photons may be generated that can be detected by 49. The number of detected photons, i.e. the intensity of the detected light, is proportional to the number of collisions that have taken place between secondary electrons and gas molecules. Consequently, the detected light intensity is directly related to the secondary electron signal from the sample.

FIG. 8 further illustrates a data processing unit 55 that combines the signals from the outputs 39, 46, 48 and 51 of said detector combinations 32, 38, 39 and 36, 45, 46 and 42, 47, 48 and 49, 50, 51, and, together with any other information obtained from the particle-optical device (not depicted), forms an image of the sample. This image can be displayed on display device 57, or can be sent to a computer 56, where it can be further processed.

In another embodiment of the invention the sample mount 42 may be biased at a potential. A negative potential will enhance the strength of the magnetic Penning mechanism by increasing the field strength. It is also advantageous to apply a bias potential to the separation diaphragm 37 to achieve the same objective.

While the disclosure above includes a description of a theoretical mechanism thought by applicants to account for the unexpected large amplification of embodiments of the present invention, the invention has been shown to work in practice, and the validity of the invention does not depend upon the correctness of the theoretical premises.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A particle-optical apparatus comprising a sample holder arranged for receiving a sample, a particle source arranged for producing a primary beam of first electrically charged particles along an optical axis for irradiating said sample, a first detector having an aperture and arranged for detecting electron signals originating from the sample due to said irradiation, a detection space formed by at least said sample holder and said first detector, and an immersion lens arranged for providing a magnetic field for focusing the primary beam in the vicinity of the sample holder, wherein said first detector is arranged for providing an electric field in the detection space, and wherein the detection space includes a gas, said first detector and said immersion lens arranged for providing the electric field and the magnetic field such that the detection space comprises a first portion in which the electric field includes a component ("E") that is oriented transverse to the magnetic field ("B") and in which $2*m*(E/B)^2/q$ is greater than the ionization energy of the gas, where "m" is the mass of an electron and "q" is the charge of an electron, the apparatus operating in an amplification domain that provides magnetron enhanced amplification of an electron signal from the sample.

2. Particle-optical apparatus according to claim 1, wherein said first detector and said immersion lens are further arranged for providing the electric field and the magnetic field such that the detection space comprises a second portion in which the electric field and the magnetic field are parallel.

3. Particle-optical apparatus according to claim 2, wherein said first detector comprise a first electrode arranged for providing the electric field and for detecting said electron signals, and wherein the aperture comprises a central opening which is symmetrically formed around the optical axis.

4. Particle-optical apparatus according to claim 2 in which the transverse component of the electric field is such that the apparatus operates in an amplification domain that provides combined magnetic Penning enhanced amplification and magnetron enhanced amplification.

5. Particle-optical apparatus according to claim 2 in which the electric field includes a substantially radial component within a region inside the aperture and includes a component substantially parallel to the optical axis within a region above and below the aperture.

6. Particle-optical apparatus according to claim 1, wherein said first detector comprise a first electrode arranged for providing the electric field and for detecting said electron signals, and wherein the aperture comprises a central opening which is symmetrically formed around the optical axis.

7. Particle-optical apparatus according to claim 1, further comprising an ion collector arranged to collect ions that are liberated in the gas due to interactions between the gas and said electrons.

8. Particle-optical apparatus according to claim 1, further comprising a second detector arranged for detecting second charged particles, such as ions, that are liberated in the gas due to interactions between the gas and said electrons.

9. Particle-optical apparatus according to claim 8, wherein the second detector comprises a second electrode, wherein said electrode is located between the sample and the first detector, and wherein the second electrode comprises a central opening that is symmetrically disposed around the optical axis.

10. Particle-optical apparatus according to claim 1, wherein the sample holder comprises a third detector.

11. Particle-optical apparatus according to claim 1, further comprising a detector arranged for detecting photons formed as a result of interactions between the gas and said electrons.

12. Particle-optical apparatus according to claim 1, further comprising means arranged for electrically biasing the sample in order to influence said field in said detection space.

13. Particle-optical apparatus according to claim 1, further comprising a plurality of further detectors arranged for detecting charged particles and for providing signals on the basis of said detecting, and means for providing an output signal that is composed of a combination of at least two signals provided by any one or more of said plurality of further detectors and said first detector.

14. Particle-optical apparatus according to claim 1 in which the apparatus provides a gas amplification greater than 1000 at an anode voltage of less than 400 V.

15. Particle-optical apparatus according to claim 1 in which the apparatus provides a gas amplification greater than 5000.

16. Particle-optical apparatus according to claim 1 in which the apparatus provides a gas amplification greater than 10000.

17. Particle-optical apparatus according to claim 1 in which the electric field includes a component that is substantially radially oriented within the aperture.

18. Particle-optical apparatus according to claim 1, wherein said first detector comprise a first electrode arranged for providing the electric field and for detecting said electron signals, and wherein substantial electrons from the sample and daughter electrons maintain cycloidal motion within the detector space without contacting the first electrode until losing energy in collisions with gas molecules, thereby increasing gas amplification particularly at low gas pressures.

19. A detector comprising a ring-shaped electrode and an amplifier, for use as first detector in a particle-optical apparatus comprising a sample holder arranged for receiving a sample, a particle source arranged for producing a primary beam of first electrically charged particles along an optical axis for irradiating said sample, a detection space formed by at least said sample holder and said first detector, and an immersion lens arranged for providing a magnetic field for focusing the primary beam in the vicinity of the sample holder, wherein said first detector is arranged for providing an electric field in the detection space and for detecting an electron signal originating from the sample due to said irradiation, and wherein the detection space is arranged for comprising a gas for amplifying electrons emanating from the sample, said first detector and said immersion lens arranged for providing the electric field and the magnetic field such that the detection space comprises a first portion in which a component ("E") of electric field is oriented transverse to the magnetic field ("B") and such that $2*m*(E/B)^2/q$ is greater than the ionization energy of the gas, where "m" is the mass of an electron and "q" is the charge of an electron, the apparatus operating in an amplification domain that provides magnetron enhanced amplification of an electron signal from the sample.

20. Method of detecting electron signals in a particle-optical apparatus wherein a sample is irradiated by a primary beam of charged particles and secondary electrons are liberated from said sample by said irradiation, wherein said secondary electrons are accelerated towards a detector and a detection space is at least formed by said detector and said sample, said detection space comprising a gas that is ionized by the secondary particles to amplify the secondary particle signal, and wherein an immersion lens provides a magnetic field in said detection space, said electric field and said magnetic field provided such that the detection space comprises at least a portion wherein a component ("E") of electric field is oriented transverse to the magnetic field ("B") and wherein $2*m*(E/B)^2/q$ is greater than the ionization energy of the gas, where "m" is the mass of an electron and "q" is the charge of an electron, the apparatus operating in an amplification domain that provides magnetron enhanced amplification of an electron signal from the sample.

21. The method of claim 20 in which the detection space comprises at least a portion wherein the electric field includes a component parallel TO the magnetic field to enhanced gas amplification using a Penning effect.

22. The method of claim 20 in which the electric and magnetic fields produce electron motion such that at least some secondary or daughter electrons will not impact the electrode before colliding with gas molecules.

23. A particle-optical apparatus, comprising:
a particle source arranged for producing a primary beam of electrically charged particles and directing the primary beam along an optical axis for irradiating a sample;
a first detector arranged for detecting electron signals emanating from the sample due to said irradiation and amplified by a gas;
an amplification space including a gas for ionization and comprising a first region including a magnetic field and an electric field having a component "E" transverse to the magnetic field such that $2*m*(E/B)^2/q$ is greater than the ionization energy of the gas, where m is the mass of an electron, "q" is the charge of an electron and "B" is the axial component of the magnetic field, and in which the amplification space further comprises a second region in which the electric field includes a component parallel to the magnetic field, the apparatus proving gas amplification through a combination of Penning and magnetron effects.

24. The apparatus of claim 23 further comprising a magnetic immersion lens having a first pole positioned between the sample and the particle source to provide the magnetic field and in which:
the first detector includes an electrode positioned between the sample and the first pole and having an aperture; and
the amplification space being positioned between the sample and the first pole, the magnetic immersion lens providing within the aperture the magnetic field and the electrode providing the electric field.

25. The apparatus of claim 24 in which the electrode is maintained at a positive electrical potential relative to the sample and to the first pole to provide the electric field.

26. The particle-optical apparatus of claim 24 in which the gas amplification is greater than 1000 at an anode voltage of less than 400 V.

27. A particle-optical apparatus, comprising:
a particle source arranged for producing a primary beam of electrically charged particles and directing the primary beam along an optical axis for irradiating a sample;
a magnetic immersion lens having a first pole positioned between the sample and the particle source;
a first detector arranged for detecting electron signals emanating from the sample due to said irradiation and amplified by a gas, the first detector having an aperture and being maintained at a positive electrical potential relative to the sample and to the first pole;
an amplification space between the sample and the first pole, the amplification space including a gas for ionization, the magnetic immersion lens providing within the aperture a magnetic field, the detector providing an substantially radially directed electric field within a region of the aperture and providing an electric field having a component parallel to the magnetic field in a second region, the combination of the electric fields and magnetic field providing a gas amplification of greater than 500 at an anode voltage of less than 350 V.

28. The particle-optical apparatus of claim 27 in which the gas amplification is greater than 1000 at an anode voltage of less than 400 V.

* * * * *